(12) United States Patent
Lin et al.

(10) Patent No.: US 12,557,358 B2
(45) Date of Patent: Feb. 17, 2026

(54) NANOSHEET SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Zhi-Chang Lin, Hsinchu (TW); Ko-Feng Chen, Hsinchu (TW); Chien-Ning Yao, Hsinchu (TW); Chien-Hung Lin, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 408 days.

(21) Appl. No.: 18/173,478

(22) Filed: Feb. 23, 2023

(65) Prior Publication Data

US 2024/0170534 A1    May 23, 2024

Related U.S. Application Data

(60) Provisional application No. 63/426,846, filed on Nov. 21, 2022.

(51) Int. Cl.
| | |
|---|---|
| *H10D 30/01* | (2025.01) |
| *H01L 21/768* | (2006.01) |
| *H10D 30/43* | (2025.01) |
| *H10D 30/67* | (2025.01) |
| *H10D 62/10* | (2025.01) |
| *H10D 62/13* | (2025.01) |

(Continued)

(52) U.S. Cl.
CPC ..... *H10D 62/121* (2025.01); *H01L 21/76876* (2013.01); *H10D 30/014* (2025.01); *H10D 30/43* (2025.01); *H10D 30/6757* (2025.01); *H10D 62/151* (2025.01); *H10D 64/018* (2025.01); *H10D 84/0128* (2025.01); *H10D 84/038* (2025.01)

(58) Field of Classification Search
None
See application file for complete search history.

(56) References Cited

U.S. PATENT DOCUMENTS 10,943,989 B2 * 3/2021 Wu ............ H10D 64/017
2022/0320119 A1 * 10/2022 Jiang ............ H10B 51/10

(Continued)

*Primary Examiner* — Michael Lebentritt
(74) *Attorney, Agent, or Firm* — Birch, Stewart, Kolasch & Birch, LLP

(57) ABSTRACT

A method for manufacturing a nanosheet semiconductor device includes: forming a liner layer to cover first and second fin structures, each of the fin structures including a stacked structure, a poly gate disposed on the stacked structure, and inner spacers, the stacked structure including sacrificial features covered by the inner spacers, and channel features disposed to alternate with the sacrificial features; forming a dielectric layer to cover the liner layer, the dielectric layer including an upper portion, a lower portion, and an interconnecting portion that interconnects the upper and lower portions and that laterally covers the liner layer; subjecting the upper and lower portions to a directional treatment; and removing the upper and interconnecting portions of the dielectric layer and a portion of the liner layer, to form a liner and a bottom dielectric insulator disposed on the liner.

20 Claims, 12 Drawing Sheets

(51) Int. Cl.
*H10D 64/01* (2025.01)
*H10D 84/01* (2025.01)
*H10D 84/03* (2025.01)

(56) References Cited

U.S. PATENT DOCUMENTS

| | | | |
|---|---|---|---|
| 2022/0359765 A1* | 11/2022 | Young | H10D 64/017 |
| 2023/0115949 A1* | 4/2023 | Chiang | H10D 30/6735 |
| | | | 438/745 |
| 2023/0178418 A1* | 6/2023 | Shen | H01L 21/02603 |
| | | | 438/192 |
| 2025/0072037 A1* | 2/2025 | Min | H10D 30/6735 |

* cited by examiner

NANOSHEET SEMICONDUCTOR DEVICE AND METHOD FOR MANUFACTURING THE SAME

REFERENCE TO RELATED APPLICATION

This application claims priority of U.S. Provisional Application No. 63/426,846 filed on Nov. 21, 2022, the contents of which is incorporated herein by reference in its entirety.

BACKGROUND

In the integrated circuit (IC) industry, nanosheet semiconductor devices (e.g., nanosheet field-effect transistors (FETs)) have been attracted much attention because larger effective conduction width in a small layout area on a substrate of an IC chip can be accomplished. However, some elements (e.g., inner spacers) of the nanosheet semiconductor devices may be damaged during fabrication processes. Thus, the IC industry strives to prevent these elements of the nanosheet semiconductor devices from being damaged, so as to further improve the device performance of the nanosheet semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
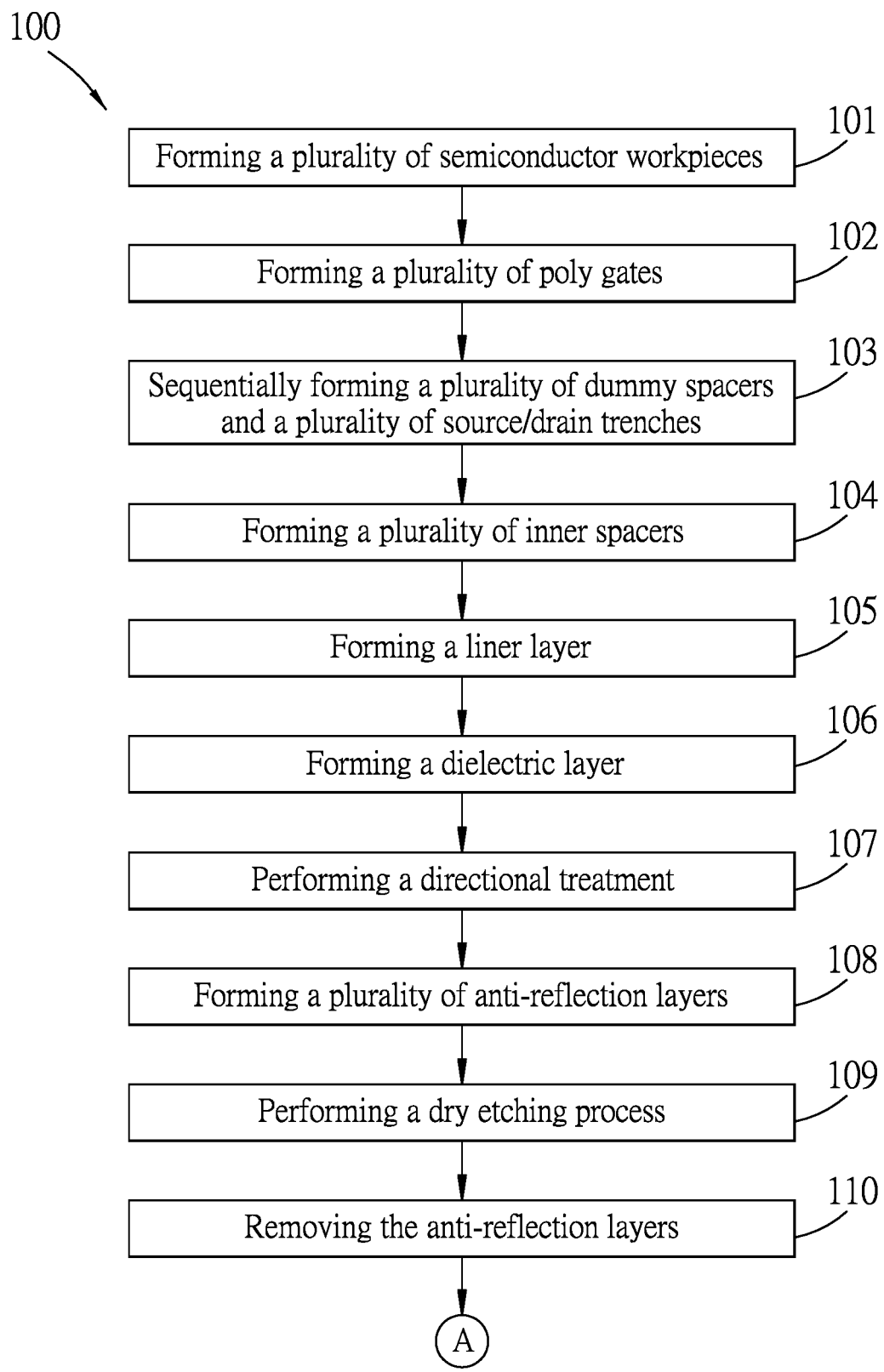
FIGS. 1A and 1B are flow diagrams illustrating a method for manufacturing a nanosheet semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," "bottommost," "topmost," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element (s) or feature(s) are exaggeratedly shown in the figures for the purposed of convenient illustration and are not in scale.

In a nanosheet semiconductor device, disposition of an inner spacer and an insulator between a source/drain region and a semiconductor substrate is conducive for enhancing a device performance of the nanosheet semiconductor device. The inner spacer is formed before formation of the insulator in a manufacturing process of the nanosheet semiconductor device. However, the inner spacer may be damaged during a deposition process using plasma (e.g., plasma-enhanced atomic layer deposition (PEALD) or plasma-enhanced chemical vapor deposition (PECVD)) for forming the insulator and a subsequent sheet formation process for forming a nanosheet structure, and thus the device performance of the nanosheet semiconductor device may be adversely affected.

Figure 1B:
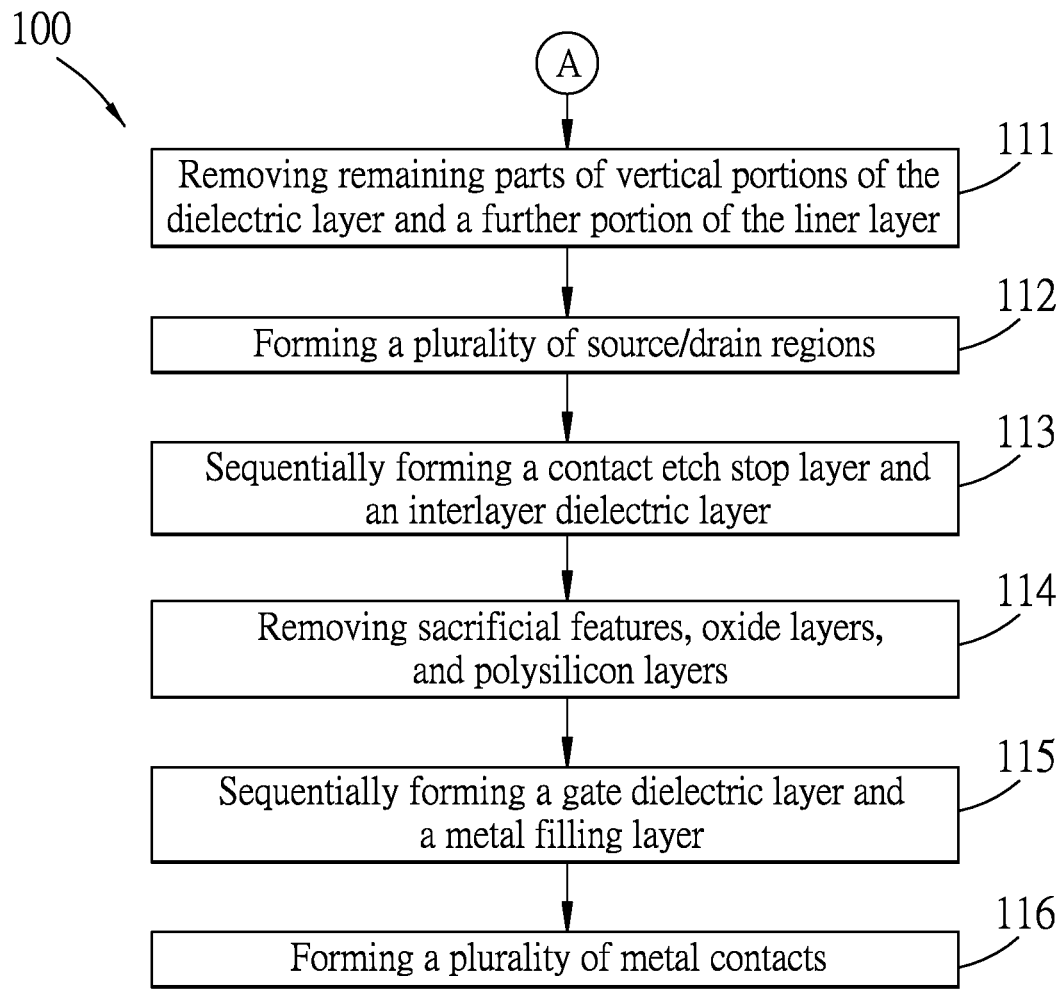

The present disclosure is directed to a nanosheet semiconductor device and a method for manufacturing the same. FIGS. 1A and 1B are flow diagrams illustrating a method 100 for manufacturing a nanosheet semiconductor device (for example, a nanosheet semiconductor device 200 shown in FIGS. 18A and 18B) in accordance with some embodiments. FIGS. 2 to 18B illustrate schematic views of the intermediate stages of the method 100. Some portions may be omitted in FIGS. 2 to 18B for the sake of brevity. Additional steps can be provided before, after or during the method 100, and some of the steps described herein may be replaced by other steps or be eliminated.

Figure 2:
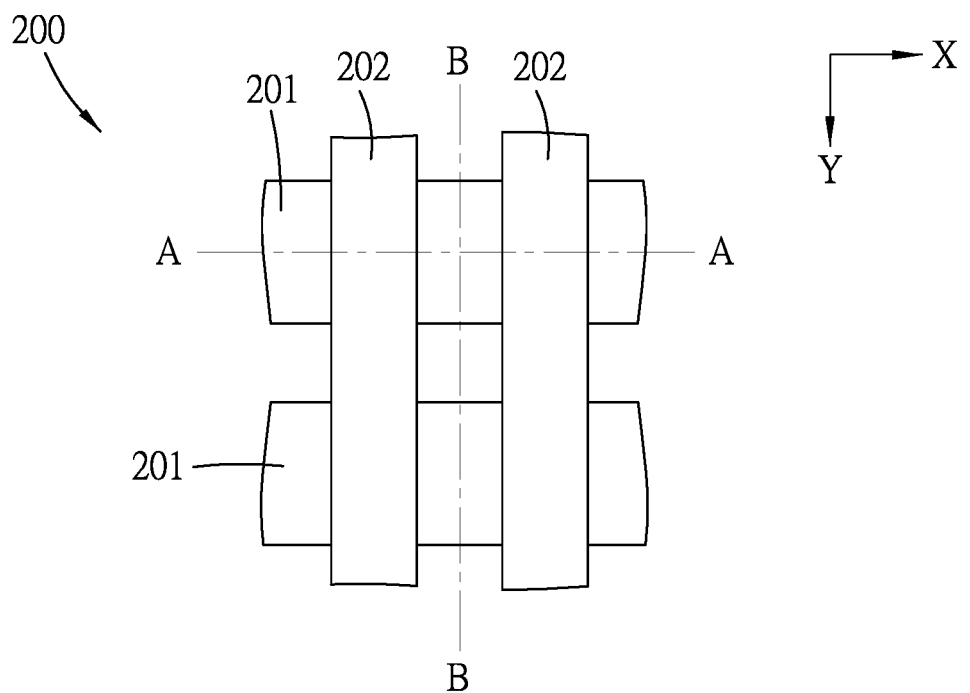
FIGS. 2 to 18B are schematic views illustrating some intermediate stages of the method as depicted in FIGS. 1A and 1B in accordance with some embodiments.
Figure 18A:
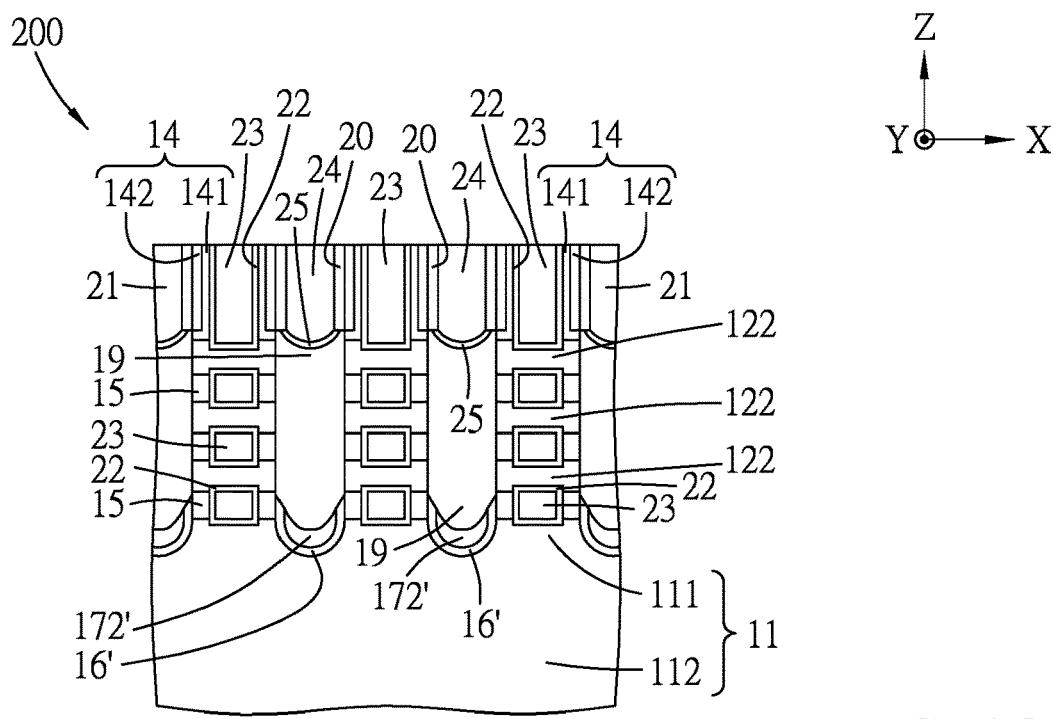
Figure 18B:
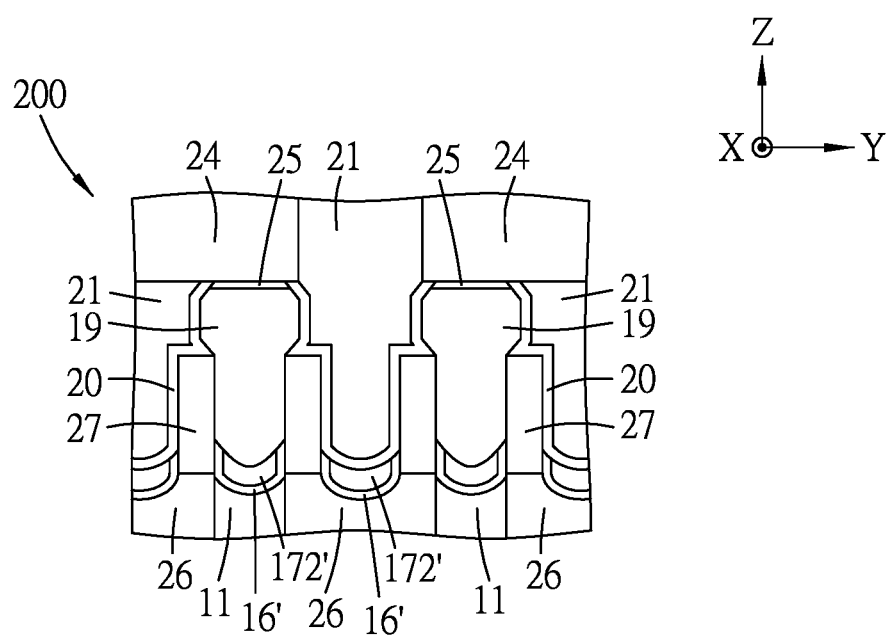

FIG. 2 is a schematic layout view of the nanosheet semiconductor device 200 shown in FIGS. 18A and 18B. The layout of the nanosheet semiconductor device 200 includes a plurality of active regions 201 and a plurality of metal gate regions 202. The active regions 201 extend in an X direction and are spaced apart from each other in a Y direction transverse to the X direction. The metal gate regions 202 extend in the Y direction and are spaced apart from each other in the X direction. In some embodiments, the active regions 201 are sometimes referred to as oxide-definition (OD) regions. In some embodiments, the metal gate regions 202 are provided for forming metal gate structures thereon.

Figure 3:
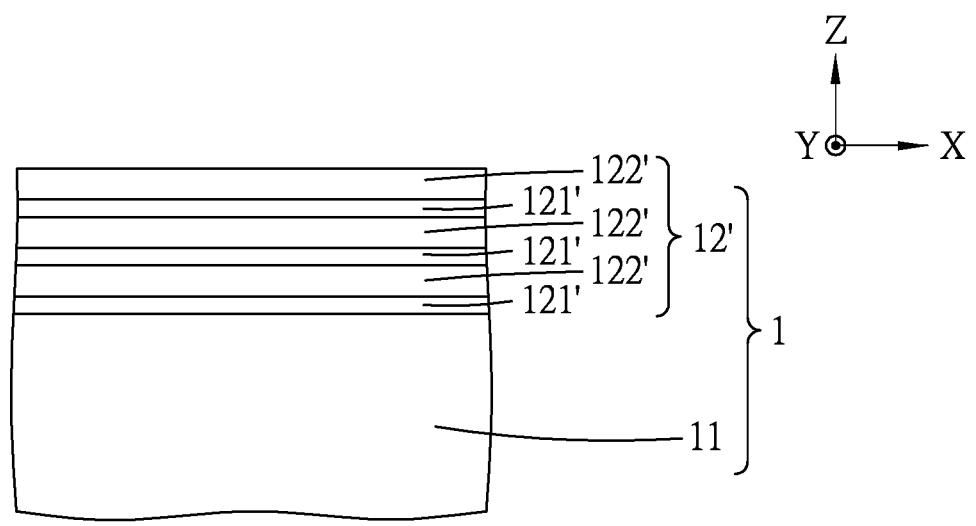

Referring to FIGS. 1A and 3, the method 100 begins at step 101, where a plurality of semiconductor workpieces 1 are formed. Step 101 may include sub-step (i) forming a nanosheet stack (not shown) over a semiconductor substrate 11, and sub-step (ii) etching portions of the nanosheet stack so as to form the semiconductor workpieces 1. In some embodiments, the semiconductor substrate 11 may include, but are not limited to, an elemental semiconductor or a compound semiconductor. The elemental semiconductor includes a single species of atoms, such as silicon (Si) or germanium (Ge) from column XIV of the periodic table, and may be crystalline, polycrystalline, or amorphous in structure. Other suitable materials for the elemental semiconductor are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the semiconductor substrate 11 may include a multilayer compound semiconductor structure. In some embodiments, the nanosheet stack includes a plurality of sacrificial layers (not shown) and a plurality of channel layers (not shown) which are alternately stacked on the semiconductor substrate 11. In some embodiments, the sacrificial layers may include silicon germanium (SiGe). Other suitable materials for the sacrificial layers are within the contemplated scope of the present disclosure. In some embodiments, the channel layers may include silicon (Si). Other suitable materials for the channel layers are within the contemplated scope of the present disclosure. The sacrificial layers and the channel layers may be formed by a suitable deposition process, for example, but are not limited to, chemical vapor deposition (CVD) (e.g., ultra-high vacuum CVD (UHV-CVD)) or other suitable deposition processes. In some embodiments, the sacrificial layers and the channel layers may be formed by a suitable epitaxial process, for example, but not limited to, molecular beam epitaxy (MBE) or other suitable epitaxial processes. In some embodiments, the semiconductor workpieces 1 are spaced apart from each other in the Y direction. In some embodiments, the semiconductor workpieces 1 are located in the active regions 201 (see FIG. 2), respectively. In some embodiments, each of the semiconductor workpieces 1 includes a portion of the semiconductor substrate 11 and a semiconductor stack 12' disposed on the portion of the semiconductor substrate 11 in a Z direction transverse to the X and Y directions. In some embodiments, the semiconductor stack 12' includes a plurality of sacrificial layer portions 121' which are parts of the sacrificial layers of the nanosheet stack, and a plurality of channel layer portions 122' which are parts of the channel layers of the nanosheet stack, where the sacrificial layer portions 121' and the channel layer portions 122' are alternately stacked over one another along the Z direction.

Figure 4:
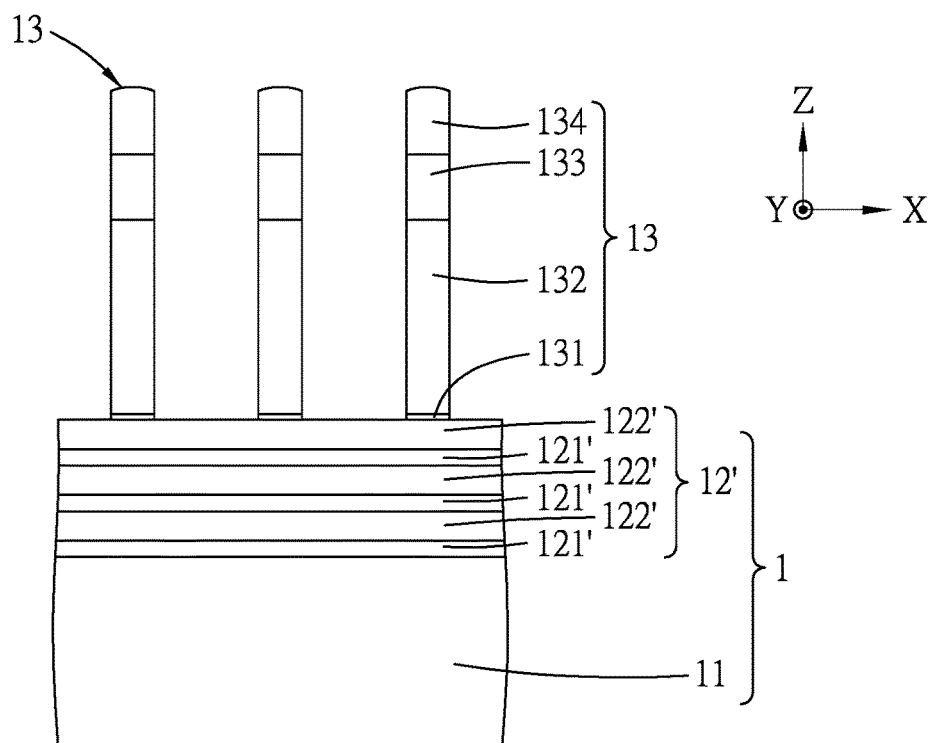

Referring to FIGS. 1A and 4, the method 100 then proceeds to step 102, where a plurality of poly gates 13 are respectively formed on the semiconductor workpieces 1 in the Z direction. The poly gates 13 are spaced apart from each other in the X direction. Each of the poly gates 13 includes an oxide layer 131, a polysilicon layer 132, a first mask layer 133, and a second mask layer 134 that are sequentially formed on the semiconductor workpieces 1 in the Z direction. Step 102 may include sub-step (i) sequentially depositing respective material layers for the oxide layer 131, the polysilicon layer 132, the first mask layer 133, and the second mask layer 134 on the semiconductor workpieces 1, and then sub-step (ii) patterning the material layers by a photolithography process, so as to obtain the oxide layer 131, the polysilicon layer 132, the first mask layer 133, and the second mask layer 134.

The oxide layer 131 is disposed on the semiconductor workpiece 1 and may include silicon oxide. Other suitable materials for the oxide layer 131 are within the contemplated scope of the present disclosure. The material layer for the oxide layer 131 may be formed by a suitable deposition process, for example, but not limited to, CVD, atomic layer deposition (ALD), or other suitable deposition processes. In some embodiments, the oxide layer 131 may serve as an etch stop layer.

The polysilicon layer 132 is disposed on the oxide layer 131 opposite to the semiconductor workpiece 1. The material layer for the polysilicon layer 132 may be formed by a suitable deposition process, for example, but not limited to, CVD, ALD, physical vapor deposition (PVD), plating, or other suitable deposition processes.

The first mask layer 133 is disposed on the polysilicon layer 132 opposite to the oxide layer 131, and may be made of a nitride-based material (e.g., silicon nitride). The second mask layer 134 is disposed on the first mask layer 133 opposite to the polysilicon layer 132, and may be made of an oxide-based material (e.g., silicon oxide). Other suitable materials for the first mask layer 133 and the second mask layer 134 are within the contemplated scope of the present disclosure. The first mask layer 133 and the second mask layer 134 may be formed by a suitable deposition process, for example, but not limited to, CVD, PECVD, ALD, PEALD, or other suitable deposition processes.

Figure 5:
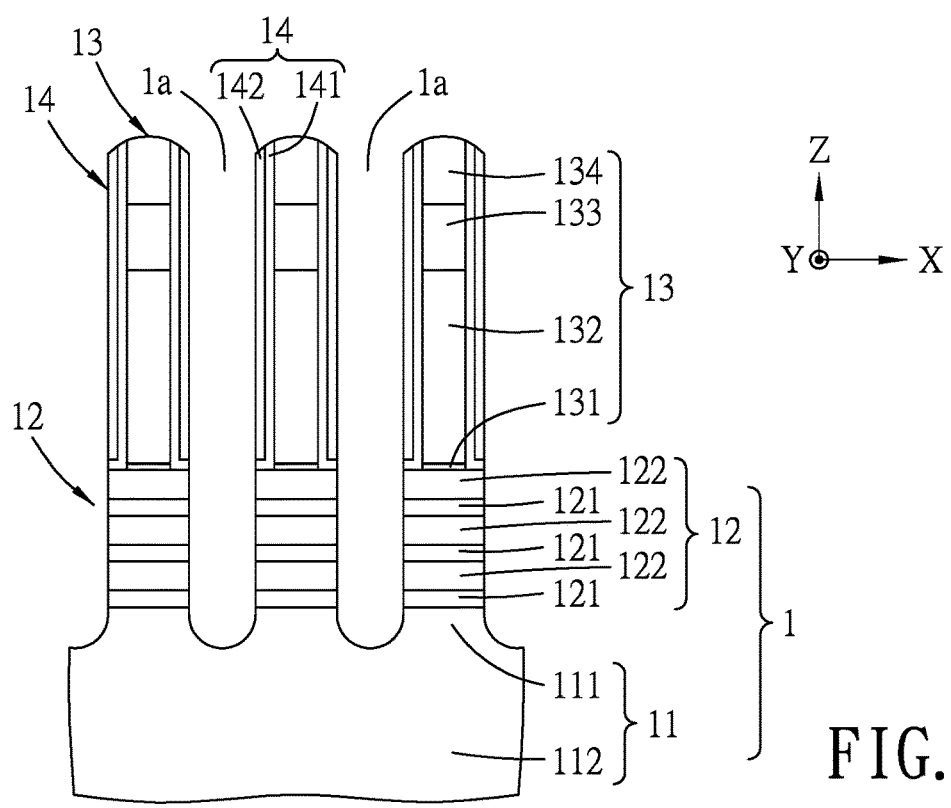

Referring to FIGS. 1A and 5, the method 100 then proceeds to step 103, where a plurality of dummy spacers 14 are formed to laterally cover the poly gates 13, followed by recessing the semiconductor stack 12' (see FIG. 4) to form a plurality of source/drain trenches 1a. Step 103 may include sub-step (i) conformally forming at least one dummy spacer material layer (not shown) over the structure shown in FIG. 4, sub-step (ii) anisotropically etching the at least one dummy spacer material layer such that horizontal portions of the at least one dummy spacer material layer are etched away to form the dummy spacers 14, and then sub-step (iii) conducting a photolithography process to recess the semiconductor stack 12', thereby forming the source/drain trenches 1a and a plurality of stacked structures 12, two adjacent ones of which are spaced apart from each other by a corresponding one of the source/drain trenches 1a. Each of the stacked structures 12 includes a plurality of sacrificial features 121 and a plurality of channel features 122 disposed to alternate with the sacrificial features 121 in the Z direction.

The at least one dummy spacer material layer may be formed by a suitable deposition process, for example, but not limited to, CVD, PECVD, PVD, ALD, PEALD, or other suitable deposition processes. The dummy spacers 14 may include, for example, but not limited to, silicon oxide, silicon nitride, silicon carbide, silicon oxycarbide, silicon oxynitride, silicon carbonitride, silicon oxycarbonitride, or combinations thereof. In some embodiments, each of the dummy spacers 14 may include an inner dummy spacer 141 that laterally covers a corresponding one of the poly gates 13 and an outer dummy spacer 142 that is disposed on a sidewall of the inner dummy spacer 141. The source/drain trenches 1a are spaced apart from each other in the X direction. Each of the source/drain trenches 1a may penetrate through an upper portion 111 of the semiconductor substrate 11, and may terminate at a lower portion 112 of the semiconductor substrate 11.

Figure 6:
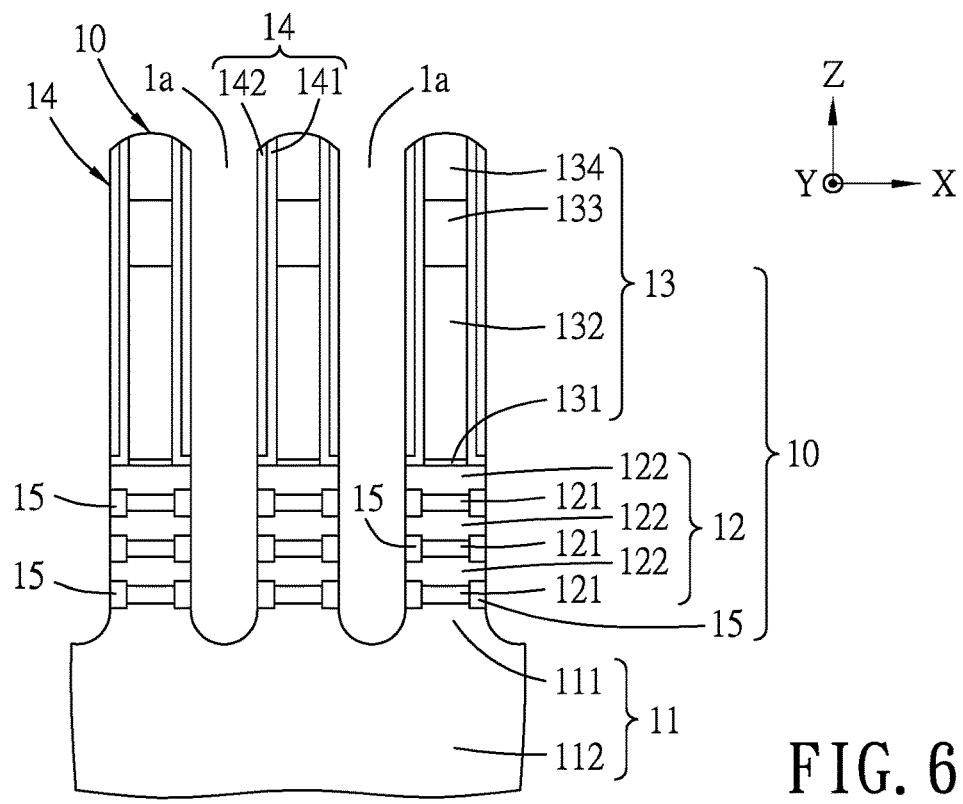

Referring to FIGS. 1A and 6, the method 100 then proceeds to step 104, where a plurality of inner spacers 15 are formed. Step 104 may include sub-step (i) laterally recessing the sacrificial features 121 by an isotropic etching process to remove side portions of the sacrificial features 121 based on a relatively high etching selectivity of the sacrificial features 121 with respect to the channel features 122, so as to form lateral recesses (not shown); sub-step (ii) conformally forming an inner spacer material layer (not shown) to cover the semiconductor substrate 11, the channel features 122, the poly gates 13 and the dummy spacers 14, and to fill the lateral recesses; and sub-step (iii) isotropically etching the inner spacer material layer to form the inner spacers 15 in the lateral recesses to laterally cover the sacrificial features 121. A plurality of fin structures 10 are formed accordingly. The fin structures 10 are disposed on the semiconductor substrate 11 and are spaced apart from each other in the X direction. Each of the fin structures 10 includes a corresponding one of the stacked structures 12 disposed on the semiconductor substrate 11, a corresponding one of the poly gates 13 disposed on the corresponding one of the stacked structures 12 in the Z direction, and a plurality of the inner spacers 15 laterally covering the sacrificial features 121.

The inner spacer material layer may be formed by a suitable deposition process, for example, but not limited to, CVD, PECVD, PVD, ALD, PEALD, or other suitable deposition processes. The inner spacers 15 may include, for example, but not limited to, silicon oxide, silicon nitride, silicon carbide, silicon oxycarbide, silicon oxynitride, silicon carbonitride, silicon oxycarbonitride, low dielectric constant (k) materials, or combinations thereof. The isotropic etching process may be dry isotropic etching, wet isotropic etching, or a combination thereof.

Figure 7:
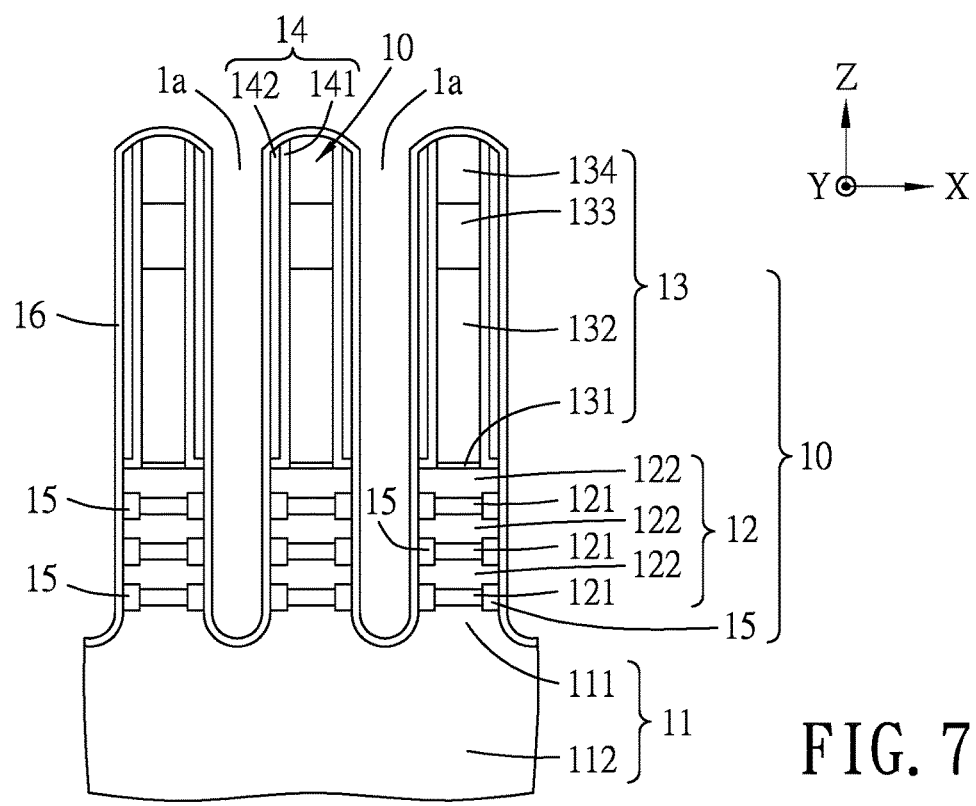

Referring to FIGS. 1A and 7, the method 100 then proceeds to step 105, where a liner layer 16 is conformally formed over the structure shown in FIG. 6, so as to cover the fin structures 10. The liner layer 16 may include, for example, but not limited to, silicon nitride, silicon oxycarbide, silicon carbonitride, silicon oxycarbonitride, or combinations thereof. Other suitable materials for the liner layer 16 are within the contemplated scope of the present disclosure. The liner layer 16 may be formed by CVD with parameters. In some embodiments, the CVD may be a thermal CVD, so that the inner spacers 15 may not be damaged during the thermal CVD process. In some embodiments, the gas used in the CVD may be, for example, but not limited to, chlorosilane ($SiH_xCl_y$), ammonia ($NH_3$), oxygen gas ($O_2$), methane ($CH_4$), ethane ($C_2H_6$), ethylene ($C_2H_4$), propylene ($C_3H_6$), other hydrocarbons ($C_xH_y$), tetramethyldisiloxane, silicon-containing hydrocarbons ($Si_xC_yH_z$), other suitable gases, or combinations thereof. In some embodiments, chlorosilane ($SiH_xCl_y$) may serve as an unlimited example of a silicon-containing precursor. In some embodiments, ammonia may serve as an unlimited example of a nitrogen-containing precursor. In some embodiments, oxygen gas may serve as an unlimited example of an oxygen-containing precursor. In some embodiments, methane ($CH_4$), ethane ($C_2H_6$), ethylene ($C_2H_4$), propylene ($C_3H_6$), other hydrocarbons ($C_xH_y$), tetramethyldisiloxane, silicon-containing hydrocarbons ($Si_xC_yH_z$) may serve as unlimited examples of a carbon-containing precursor. In some embodiments, the parameters of CVD may include a temperature during deposition that ranges from about 450° C. to about 550° C. If the temperature during deposition is less than about 450° C., formation of the liner layer 16 may be adversely affected. If the temperature during deposition is greater than about 550° C., the liner layer 16 may not be easily removed in subsequent process (i.e., step 111 in the flow chart 100 shown in FIG. 1B), and formation of bottom dielectric insulators 172' (which will be described hereinafter with reference to FIG. 13) may be adversely affected. In some embodiments, the parameters of CVD may include a deposition period ranging from about 60 seconds to about 120 seconds. If the deposition period is less than about 60 seconds, the liner layer 16 may be degraded and the inner spacers 15 will not be well protected during formation of a dielectric layer 17 (which will be described hereinafter with reference to FIG. 8). If the deposition period is greater than about 120 seconds, the liner layer 16 may not be easily removed in the subsequent process, and formation of the bottom dielectric insulators 172' may be adversely affected. In some embodiments, the liner layer 16 may have a thickness ranging from about 1 nm to about 5 nm.

Figure 8:
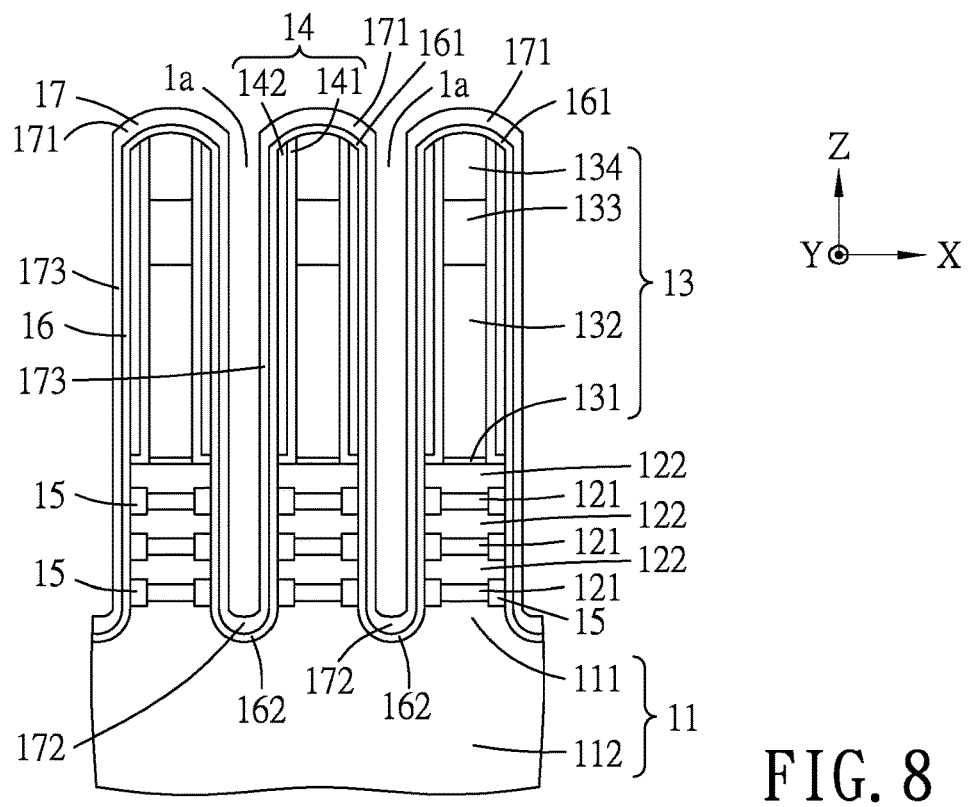

Referring to FIGS. 1A and 8, the method 100 then proceeds to step 106, where a dielectric layer 17 is conformally formed over the structure shown in FIG. 7, so as to cover the liner layer 16. The dielectric layer 17 may be formed by a suitable deposition process, for example, but not limited to, CVD, PECVD, ALD, PEALD, or other suitable deposition processes. The dielectric layer 17 may include, for example, but not limited to, silicon nitride, silicon oxycarbide, silicon carbonitride, silicon oxycarbonitride, or combinations thereof. Other suitable materials for the dielectric layer 17 are within the contemplated scope of the present disclosure. It is noted that without formation of the liner layer 16 (i.e., step 105 in the flow chart 100 shown in FIG. 1A), the inner spacers 15 may be damaged by plasma used in the PEALD or PECVD for forming the dielectric layer 17. The dielectric layer 17 includes a plurality of upper portions 171 respectively disposed on upper portions 161 of the liner layer 16, a plurality of lower portions 172 respectively disposed on lower portions 162 of the liner layer 16, and a plurality of interconnecting portions 173, each of which extends in the Z direction to interconnect a corresponding one of the upper portions 171 and a corresponding one of the lower portions 172 and which laterally covers the liner layer 16.

Figure 9:
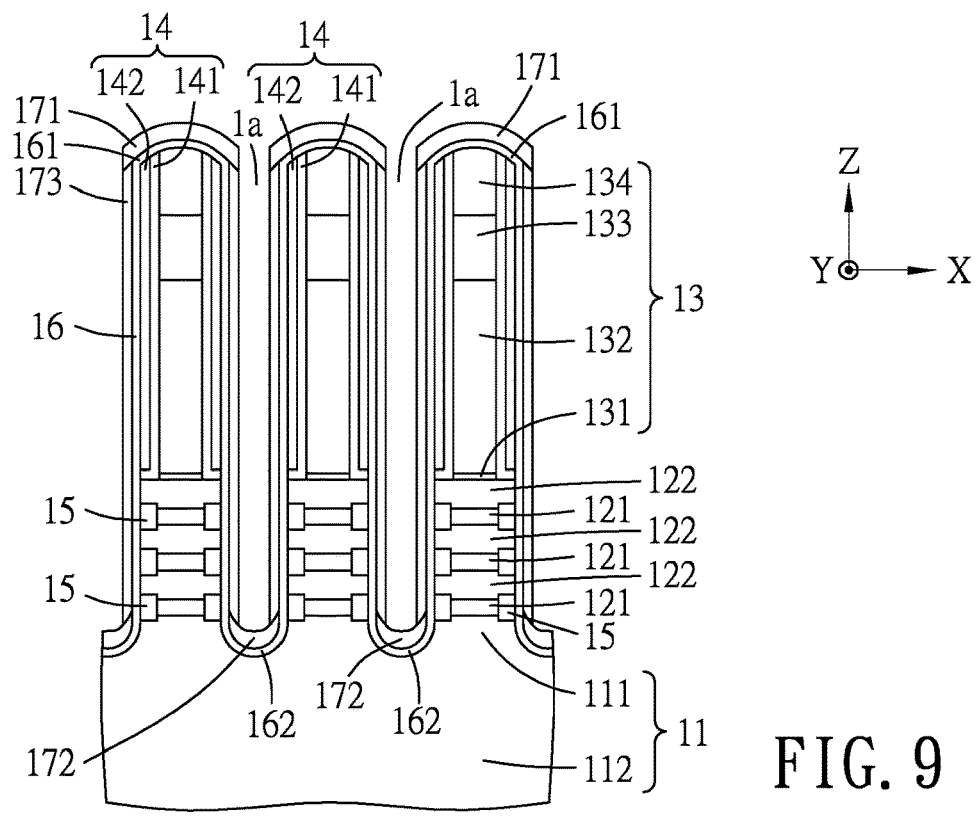

Referring to FIGS. 1A and 9, the method 100 then proceeds to step 107, where a directional treatment is conducted on the dielectric layer 17, such that horizontal portions of the dielectric layer 17 (i.e., the upper portions 171 of the dielectric layer 17, which are respectively separated from top surfaces of the poly gates 13 by the upper portions 161 of the liner layer 16; and the lower portions 172 of the dielectric layer 17, which are respectively disposed in the source/drain trenches 1a and which are separated from the upper portion 111 of the semiconductor substrate 11 by the lower portions 162 of the liner layer 16, respectively) are treated, and such that vertical portions of the dielectric layer 17 (i.e., the interconnecting portions 173, which are respectively separated from sidewalls of the outer dummy spacers 142, the channel features 122, and the inner spacers 15 by the liner layer 16) are not treated or slightly treated. In some embodiments, the directional treatment may be a directional plasma treatment. In some embodiments, a gas used in the directional plasma treatment may include argon (Ar), nitrogen ($N_2$), ammonia ($NH_3$), chlorosilane ($SiH_xCl_y$), or combinations thereof. In some embodiments, the directional plasma treatment may be performed with one of a direct current (DC) bias and a radio-frequency (RF) bias. After step 107, the horizontal portions (i.e., the upper portions 171 and the lower portions 172) of the dielectric layer 17 are denser than the vertical portions (i.e., the interconnecting portions 173) of the dielectric layer 17.

Figure 10:
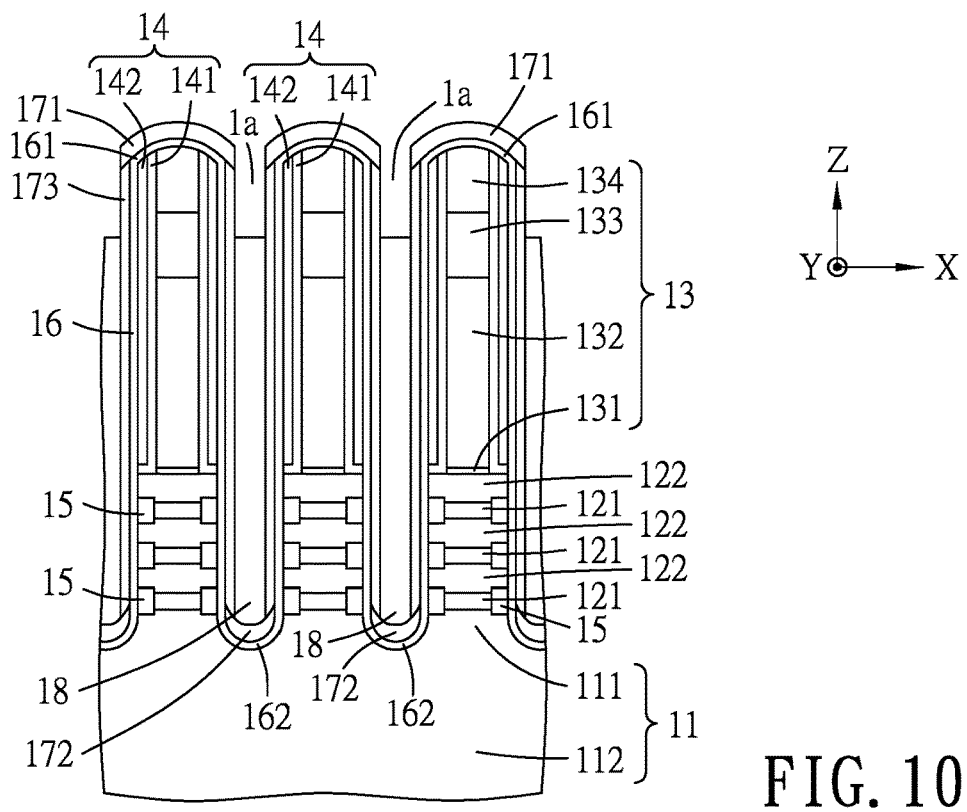

Referring to FIGS. 1A and 10, the method 100 then proceeds to step 108, where a plurality of anti-reflection layers 18 are formed in the source/drain trenches 1a, respectively. Step 108 may include sub-step (i) depositing an anti-reflection material layer (not shown) over the structure shown in FIG. 9 by a suitable deposition process, for example, but not limited to, spin-on coating or other suitable deposition processes, and sub-step (ii) removing an excess of the anti-reflection material layer by dry etching, so as to form the anti-reflection layers 18. The anti-reflection layers 18 may include a suitable organic material, for example, but not limited to, an organic polymer ($C_xH_yO_z$) including carbon, oxygen, and hydrogen. Other suitable materials for the anti-reflection layers 18 are within the contemplated scope of the present disclosure.

Figure 11:
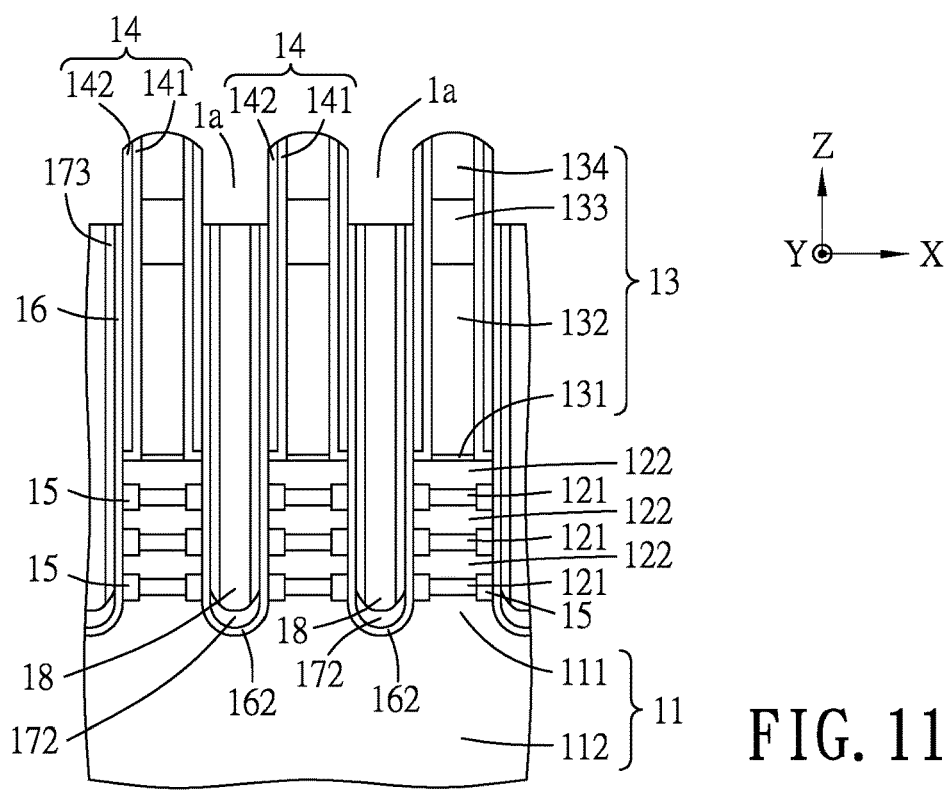

Referring to FIGS. 1A and 11, the method 100 then proceeds to step 109, where a dry etching process is conducted on the structure shown in FIG. 10, such that the upper portions 171 of the dielectric layer 17 are fully removed, and the vertical portions (i.e., the interconnecting portions 173) of the dielectric layer 17 and the liner layer 16 are partially removed.

Figure 12:
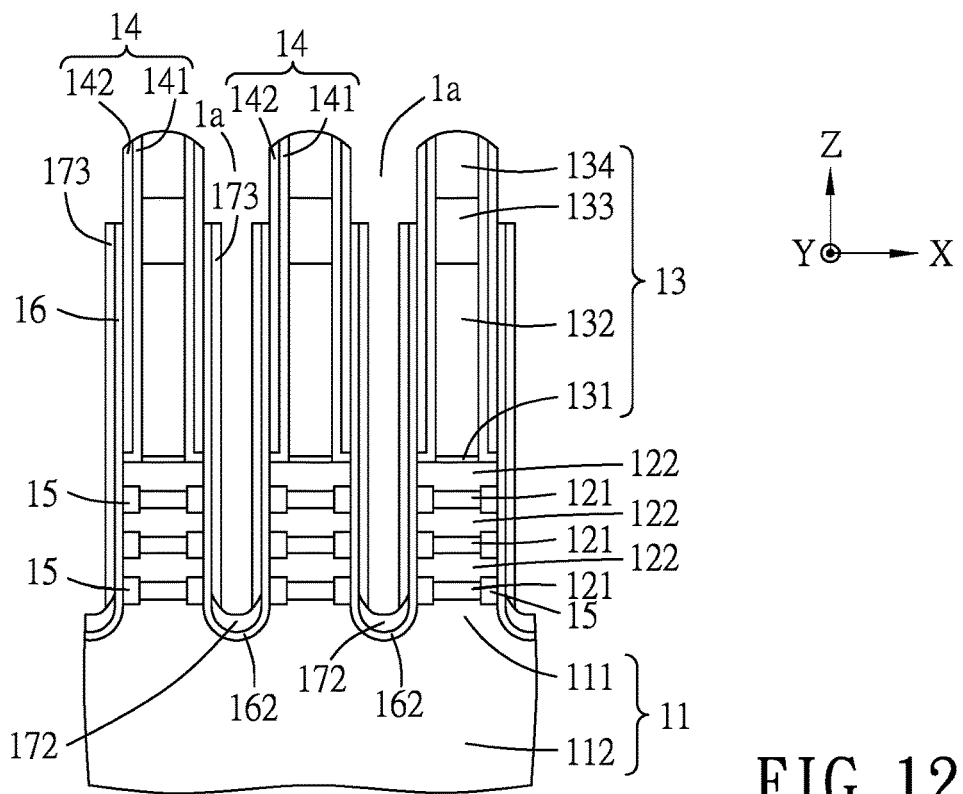

Referring to FIGS. 1A and 12, the method 100 then proceeds to step 110, where the anti-reflection layers 18 (see FIG. 11) are removed. Step 110 may be performed by a suitable process, for example, but not limited to, an ashing process or other suitable processes. In some embodiments, the ashing process may be a dry ashing process or other suitable ashing processes.

Figure 13:
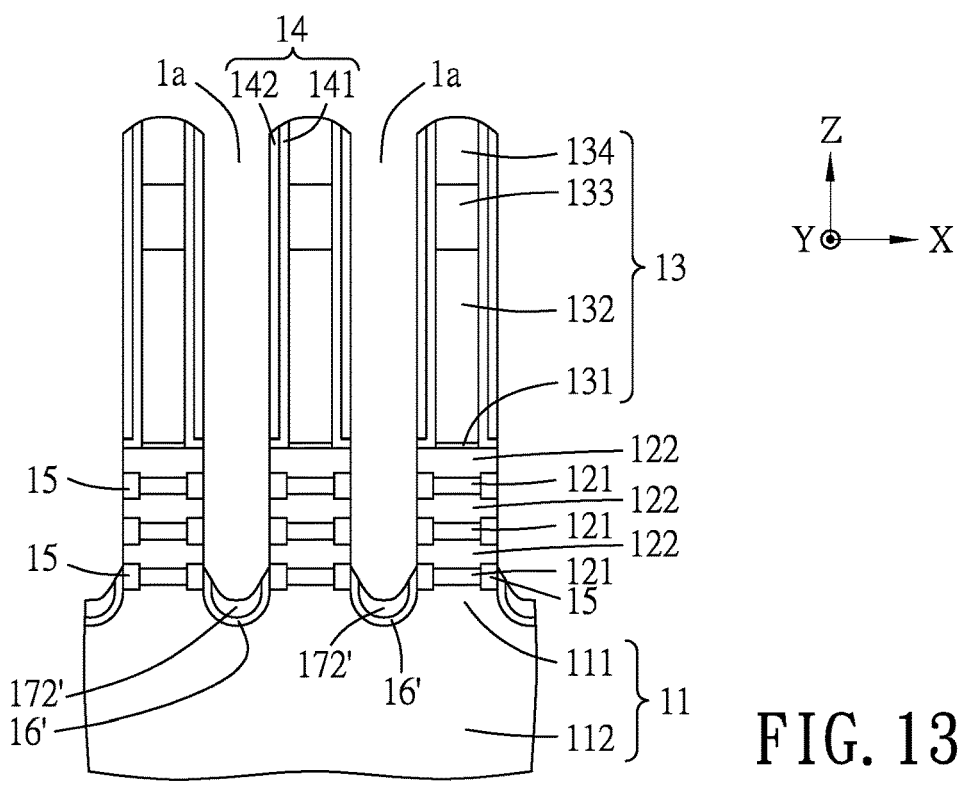

Referring to FIGS. 1B and 13, the method 100 then proceeds to step 111, where remaining parts of the vertical portions (i.e., the interconnecting portions 173) of the dielectric layer 17 and a further portion of the liner layer 16 are removed, so as to form the bottom dielectric insulators 172' and liners 16'. Step 111 may be performed by a suitable etching process, for example, but not limited to, wet etching or other suitable etching processes. In some embodiments, an etchant used in the wet etching may be diluted hydrofluoric acid or other suitable etchants. Each of the liners 16' is disposed on the semiconductor substrate 11 to separate a corresponding one of the bottom dielectric insulators 172' from the semiconductor substrate 11.

Figure 14A:
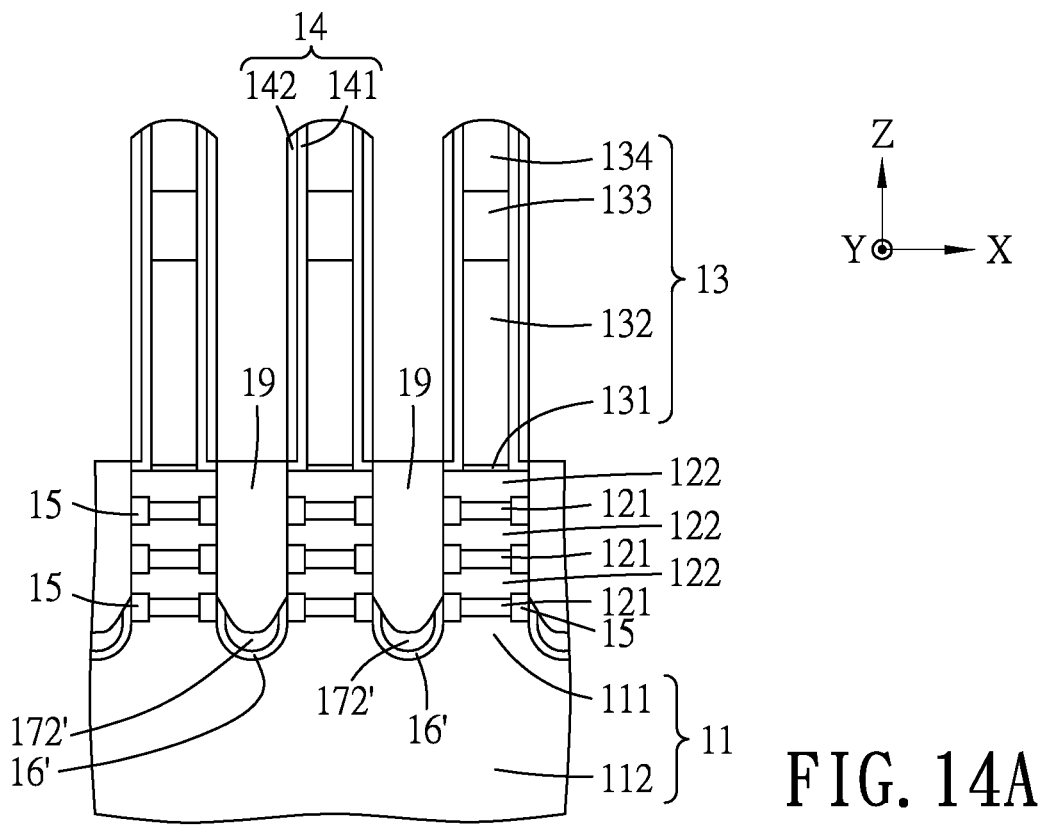
Figure 14B:
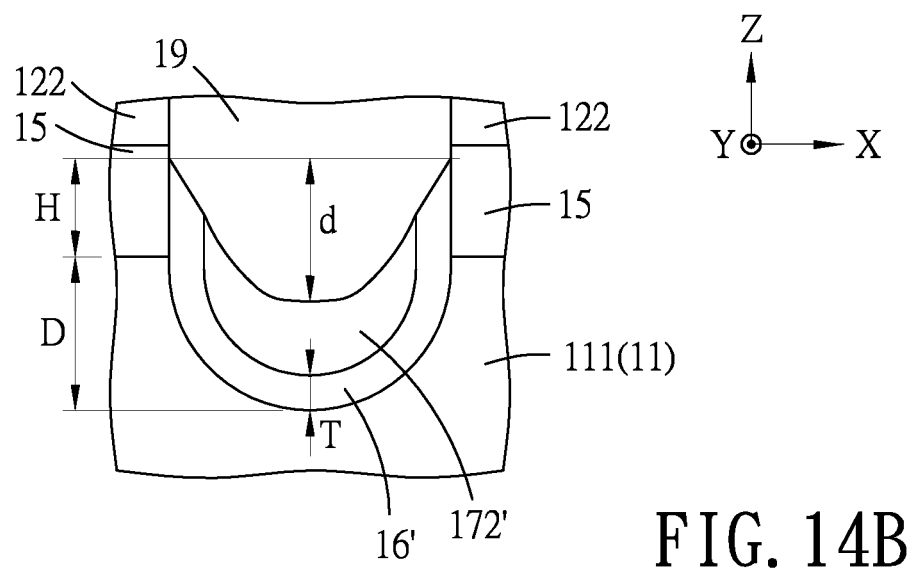

Referring to FIGS. 1B, 14A and 14B, the method 100 then proceeds to step 112, where a plurality of source/drain regions 19 are formed in the source/drain trenches 1a (see FIG. 13), respectively. FIG. 14B is a partially enlarged view of FIG. 14A. Step 112 may be performed by growing a semiconductor epitaxial layer (not shown) in the source/drain trenches 1a along the inner spacers 15 and the channel features 122 through a suitable epitaxial growth process, for example, but not limited to, a low pressure CVD (LPCVD) process, an atomic layer CVD (ALCVD) process, an ultra-high vacuum CVD (UHVCVD) process, a reduced pressure CVD (RPCVD) process, a molecular beam epitaxy (MBE) process, a metalorganic vapor phase epitaxy (MOVPE) process, or other suitable epitaxial growth processes. The source/drain regions 19 may be doped with boron (B), phosphorus (P), arsenic (As), or other suitable dopants. In some embodiments, the source/drain regions 19 may be made of one of silicon doped with phosphorus, silicon doped with boron, silicon germanium doped with boron, and silicon carbide doped with phosphorus.

In some embodiments, a vertical distance (D) between a bottommost point of a lower surface of the liner 16' and a top surface of the upper portion 111 of the semiconductor substrate 11 may range from about 3 nm to about 20 nm. When the vertical distance (D) is less than about 3 nm, formation of a nanosheet structure (which will be described hereinafter with reference to FIG. 17) may be adversely affected. When the vertical distance (D) is greater than about 20 nm, isolation structures 26 (see FIG. 18B) in the nanosheet semiconductor device 200 may be adversely affected. In some embodiments, the isolation structures 26 may be shallow trench isolations (STIs). In some embodiments, a thickness (T) of the liner 16' (or the liner layer 16) may range from about 1 nm to about 5 nm. When the thickness (T) of the liner 16' (or the liner layer 16) is less than about 1 nm, the inner spacers 15 may not be protected effectively by the liner layer 16 and thus may be damaged by plasma used during deposition of the dielectric layer 17 (i.e., step 106 in the flow chart 100 shown in FIG. 1A). When the thickness (T) of the liner 16' (or the liner layer 16) is greater than about 5 nm, the deposition of the dielectric layer 17 in the source/drain trenches 1a may be adversely affected (for example, but not limited to, an insufficient process window for forming the dielectric layer 17). In some embodiments, a vertical distance (H) between a topmost point of the liner 16' and the top surface of the upper portion 111 of the semiconductor substrate 11 may range from about 1 nm to about 10 nm. When the vertical distance (H) is less than about 1 nm, the source/drain regions 19 may be electrically connected to the semiconductor substrate 11, thereby inducing an electrical leakage of the nanosheet semiconductor device 200. When the vertical distance (H) is greater than about 10 nm, the source/drain regions 19 may have a poor electrical connection with the nanosheet structure. For example, when the vertical distance (H) is greater than about 10 nm, the bottommost one of the channel features 122 may be undesirably isolated from the source/drain regions 19 by the liner 16'. In some embodiments, an upper surface of the bottom dielectric insulator 172' may have a concave shape, a flat shape, or a convex shape. When the upper surface of the bottom dielectric insulator 172' has a concave shape, a distance (d) between a bottommost point of the upper surface of the bottom dielectric insulator 172' and the topmost point of the liner 16' may be greater than about 0 nm and up to about 15 nm (see FIG. 14B). When the upper surface of the bottom dielectric insulator 172' has a convex shape (not shown), a distance between a topmost point of the upper surface of the bottom dielectric insulator 172' and the topmost point of the liner 16' may be greater than about 0 nm and up to about 5 nm.

Figure 15:
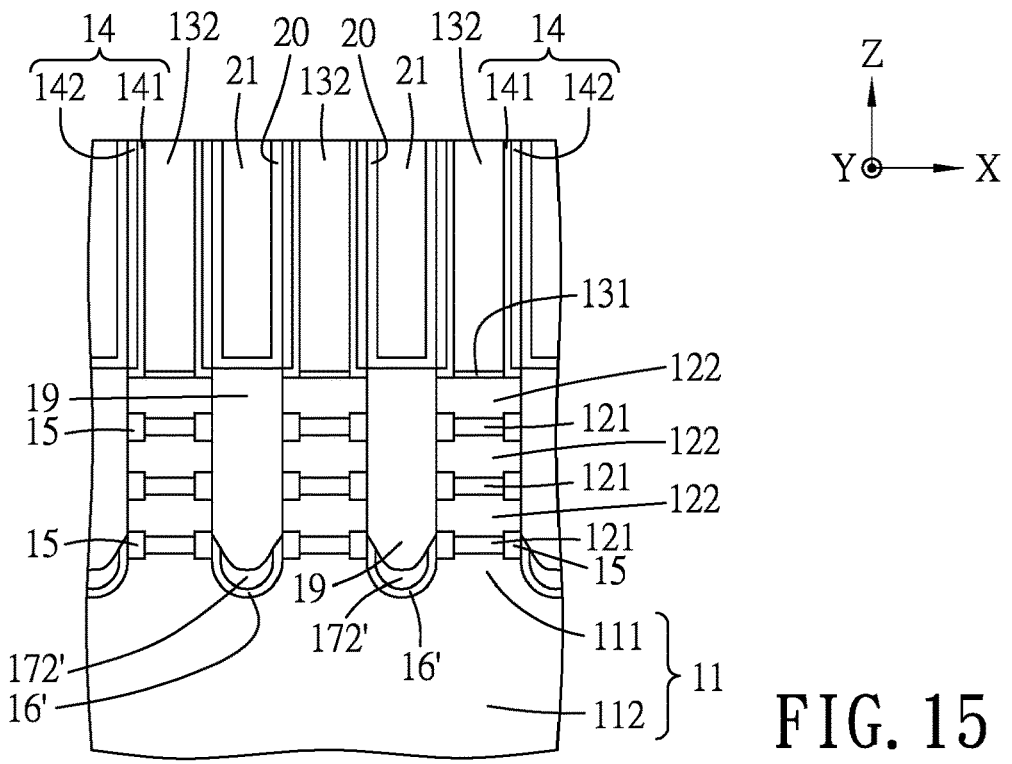

Referring to FIGS. 1B and 15, the method 100 then proceeds to step 113, where a contact etch stop layer (CESL) 20 and an interlayer dielectric (ILD) layer 21 are sequentially formed over the structure shown in FIG. 14A. Step 113 may include sub-step (i) conformally forming a contact etch stop material layer over the structure shown in FIG. 14A, sub-step (ii) blanketly forming an interlayer dielectric material layer on the contact etch stop material layer, and sub-step (iii) conducting a planarization process to remove portions of the interlayer dielectric material layer, the contact etch stop material layer, the dummy spacers 14 and the polysilicon layer 132, and all of the first and second mask layers 133, 134. The CESL 20 may include, for example, but not limited to, silicon oxide, silicon nitride, silicon oxynitride, or combinations thereof. Other suitable materials for the CESL 20 are within the contemplated scope of the present disclosure. The CESL 20 may be formed by a suitable deposition process, for example, but not limited to, CVD, PECVD, ALD, or other suitable deposition processes. The ILD layer 21 may include, for example, but not limited to, un-doped silicate glass (USG), doped silicon oxide, borophosphosilicate glass (BPSG), phosphosilicate glass (PSG), fused silica glass (FSG), boron doped silicon glass (BSG), tetraethylorthosilicate (TEOS) oxide, or combinations thereof. Other suitable materials for the ILD layer 21 are within the contemplated scope of the present disclosure. The ILD layer 21 may be formed by a suitable deposition process, for example, but not limited to, CVD, spin-on coating, or other suitable deposition processes. The planarization process may be, for example, but not limited to, chemical mechanical polishing (CMP) or other suitable planarization processes.

Figure 16:
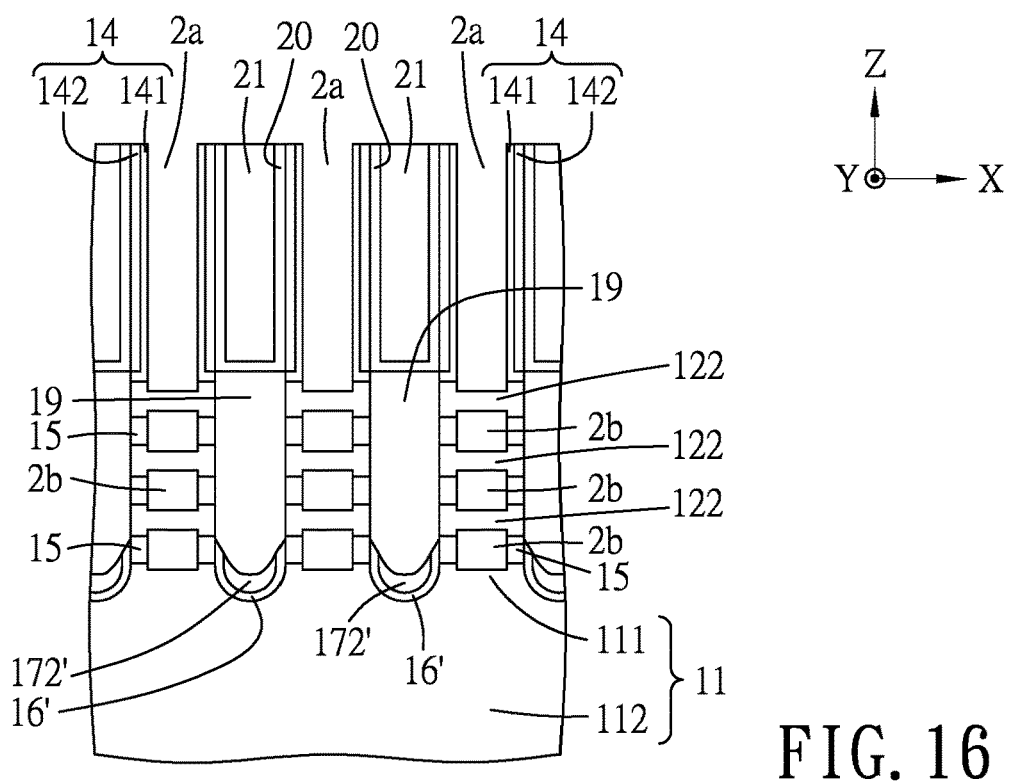

Referring to FIGS. 1B and 16, the method 100 then proceeds to step 114, where the sacrificial features 121, the oxide layers 131, and the polysilicon layers 132 (see FIG. 15) are removed, so as to form first voids 2a and second voids 2b. Step 114 may be performed by one or more etching processes. The etching process may include wet etching, dry etching, or a combination thereof. The first voids 2a are defined by the inner dummy spacers 141 and a topmost one of the channel features 122, and the second voids 2b are defined by the inner spacers 15 and the channel features 122. In some embodiments, a wet etching process is first conducted on the structure shown in FIG. 15 to remove the sacrificial features 121, the oxide layers 131, and the polysilicon layers 132, and a dry etching is then conducted to remove oxidized portions of the channel features 122 and optionally portions of the inner dummy spacers 141 that are formed during the wet etching process.

Figure 17:
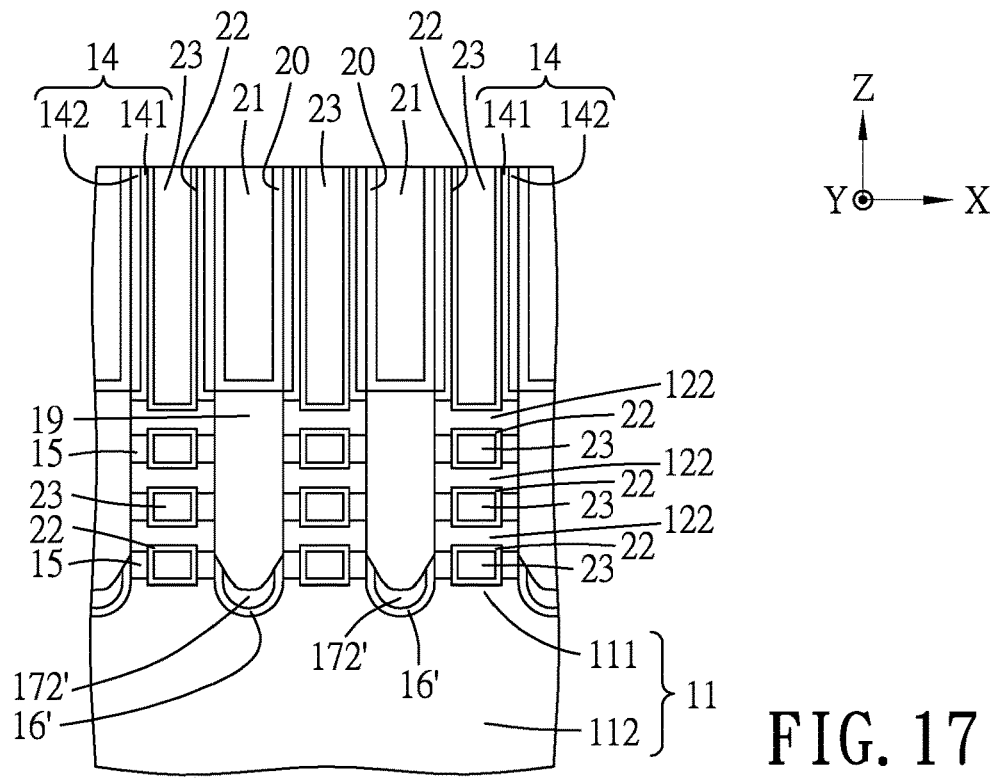

Referring to FIGS. 1B and 17, the method 100 then proceeds to step 115, where a gate dielectric layer 22 and a metal filling layer 23 are sequentially formed in the first voids 2a and the second voids 2b (see FIG. 16). Step 115 may include sub-step (i) sequentially forming the gate dielectric layer 22 and the metal filling layer 23 in the first voids 2a and the second voids 2b, and over the dummy spacers 14, the CESL 20 and the ILD layer 21, and then sub-step (ii) conducting a planarization process (e.g., CMP or other suitable planarization processes) to remove excess portions of the gate dielectric layer 22 and the metal filling layer 23 over the dummy spacers 14, the CESL 20 and the ILD layer 21. The gate dielectric layer 22 may include a sub-layer of a dielectric material and a sub-layer of a high dielectric constant (k) material. The dielectric material may include, for example, but not limited to, silicon oxide, silicon nitride, silicon oxynitride, or combinations thereof. The high-k material may include, for example, but not limited to, hafnium oxide, silicon nitride, silicon oxynitride, titanium oxide, hafnium zirconium oxide, tantalum oxide, hafnium silicon oxide, zirconium oxide, zirconium silicon oxide, lanthanum oxide, aluminum oxide, yttrium oxide, strontium titanate, barium titanate, barium zirconate, lanthanum silicon oxide, aluminum silicon oxide, hafnium lanthanum oxide, hafnium silicon oxide, aluminum silicon oxide, hafnium tantalum oxide, hafnium titanium oxide, or combinations thereof. Other suitable materials for the gate dielectric layer 22 are within the contemplated scope of the present disclosure. The gate dielectric layer 22 may be formed by a suitable deposition process, for example, but not limited to, CVD, ALD or other suitable deposition processes. The metal filling layer 23 may include, for example, but not limited to, aluminum, copper, tungsten, cobalt, ruthenium, titanium, tantalum, molybdenum, nickel, platinum, or combinations thereof. Other suitable conductive materials for the metal filling layer 23 are within the contemplated scope of the present disclosure. The metal filling layer 23 may be formed by a suitable deposition process, for example, but not limited to, CVD, PVD, electroless plating, or other suitable deposition processes. In some embodiments, the gate dielectric layer 22 and the metal filling layer 23 are collectively referred as the metal gate structures or the nanosheet structures. Step 115 may refer to a nanosheet formation process. In some embodiments, the metal gate structures or the nanosheet structures are located in the metal gate regions 202 (see FIG. 2), respectively.

Referring to FIGS. 1B, 18A and 18B, the method 100 then proceeds to step 116, where a plurality of metal contacts 24 are formed on corresponding ones of the source/drain regions 19. Step 116 may include sub-step (i) conducting a photolithography process on the structure shown in FIG. 17 to remove portions of the ILD layer 21 over the corresponding ones of the source/drain regions 19, portions of the CESL 20 over the corresponding ones of the source/drain regions 19, and portions of the corresponding ones of the source/drain regions 19 to form a plurality of openings (not shown), sub-step (ii) forming a contact material layer (not shown) for the metal contacts 24 to fill the openings, and sub-step (iii) conducting a planarization process (e.g., CMP or other suitable planarization processes) to remove an excess portion of the contact material layer, so as to form the metal contacts 24 in the openings. During the planarization process, the dummy spacers 14, the CESL 20, the ILD layer 21, the gate dielectric layer 22, the metal filling layer 23 may be partially removed. The metal contacts 24 may include, for example, but not limited to, aluminum, copper, tungsten, cobalt, ruthenium, titanium, tantalum, molybdenum, nickel, platinum, or combinations thereof. Other suitable conductive materials for the metal contacts 24 are within the contemplated scope of the present disclosure. The contact material layer for the metal contacts 24 may be formed by a suitable deposition process, for example, but not limited to, CVD, PVD, ALD, or plating (e.g., electroplating, electroless plating or other suitable plating processes). In some embodiments, after formation of the openings and before formation of the contact material layer, a plurality of silicides 25 may be formed in the openings, respectively. The silicides 25 may include, for example, but not limited to, titanium silicide (TiSi), nickel silicide (NiSi), or a combination thereof. Other suitable materials for the silicides 25 are within the contemplated scope of the present disclosure. After step 116, the nanosheet semiconductor device 200 is obtained.

FIGS. 18A and 18B are schematic views taken along line A-A in the X direction and line B-B in the Y direction of FIG. 2, respectively. As shown in FIG. 18B, a pair of sidewall spacers 27 is disposed on the isolation structure 26 and is located at two opposite sides of each of the source/drain regions 19. The sidewall spacers 27 may include, for example, but not limited to, silicon oxide, silicon nitride, silicon oxynitride, or combinations thereof.

In this disclosure, by forming a liner layer after formation of inner spacers and before formation of a dielectric layer, inner spacers may be protected by the liner layer, i.e., prevented from being damaged (e.g., caused by plasma used in PEALD or PECVD to form the dielectric layer), and may be resistant to impacts of subsequent nanosheet formation process, thereby being conducive to improving the device performance of a nanosheet semiconductor device.

In accordance with some embodiments of the present disclosure, a method for manufacturing a nanosheet semiconductor device includes: forming a liner layer to cover a first fin structure and a second fin structure that are disposed on a substrate and that are spaced apart from each other in a first direction, each of the first and second fin structures including a stacked structure disposed on the substrate, a poly gate disposed on the stacked structure in a second direction transverse to the first direction, and a plurality of inner spacers, the stacked structure including a plurality of sacrificial features and a plurality of channel features disposed to alternate with the sacrificial features in the second direction, the inner spacers laterally covering the sacrificial features; forming a dielectric layer to cover the liner layer, the dielectric layer including an upper portion, a lower portion, and an interconnecting portion that extends in the second direction to interconnect the upper portion and the lower portion and that laterally covers the liner layer; subjecting the upper and lower portions of the dielectric layer to a directional treatment, so that the upper and lower portions of the dielectric layer are denser than the interconnecting portion of the dielectric layer; and removing the upper and interconnecting portions of the dielectric layer and a portion of the liner layer, so as to form a liner on the substrate and a bottom dielectric insulator that is disposed on the liner and that is separated from the substrate by the liner.

In accordance with some embodiments of the present disclosure, the liner layer is formed by thermal chemical vapor deposition (CVD).

In accordance with some embodiments of the present disclosure, the thermal CVD is conducted at a temperature ranging from 450° C. to 550° C.

In accordance with some embodiments of the present disclosure, the thermal CVD is conducted for a deposition period ranging from 60 seconds to 120 seconds.

In accordance with some embodiments of the present disclosure, a gas used in the thermal CVD includes chlorosilane, ammonia, oxygen gas, methane, ethane, ethylene, propylene, hydrocarbon, tetramethyldisiloxane, silicon-containing hydrocarbon, or combinations thereof.

In accordance with some embodiments of the present disclosure, the liner layer has a thickness ranging from 1 nm to 5 nm.

In accordance with some embodiments of the present disclosure, the liner layer includes silicon nitride, silicon oxycarbide, silicon carbonitride, silicon oxycarbonitride, or combinations thereof.

In accordance with some embodiments of the present disclosure, a method for manufacturing a nanosheet semiconductor device includes: forming a liner layer to cover a first fin structure and a second fin structure that are disposed on a substrate and that are spaced apart from each other by a trench in a first direction, each of the first and second fin structures including a stacked structure disposed on the substrate, a poly gate disposed on the stacked structure in a second direction transverse to the first direction, and a plurality of inner spacers, the stacked structure including a plurality of sacrificial features and a plurality of channel features disposed to alternate with the sacrificial features in the second direction, the inner spacers laterally covering the sacrificial features; forming a dielectric layer to cover the liner layer, the dielectric layer including an upper portion, a lower portion, and an interconnecting portion that extends in the second direction to interconnect the upper portion and the lower portion and that laterally covers the liner layer; subjecting the upper and lower portions of the dielectric layer to a directional treatment, so that the upper and lower portions of the dielectric layer 17 are denser than the interconnecting portion of the dielectric layer; forming an anti-reflection layer in the trench such that the upper portion and a part of the interconnecting portion of the dielectric layer are exposed from the anti-reflection layer; etching away the upper portion and the part of the interconnecting portion of the dielectric layer; and removing the anti-reflection layers, a remaining part of the interconnecting portion of the dielectric layer, and a portion of the liner layer, so as to form a liner on the substrate and a bottom dielectric insulator that is disposed on the liner and that is separated from the substrate by the liner.

In accordance with some embodiments of the present disclosure, the liner layer is formed by thermal chemical vapor deposition (CVD).

In accordance with some embodiments of the present disclosure, the thermal CVD is conducted at a temperature ranging from 450° C. to 550° C.

In accordance with some embodiments of the present disclosure, the thermal CVD is conducted for a deposition period ranging from 60 seconds to 120 seconds.

In accordance with some embodiments of the present disclosure, a gas used in the thermal CVD includes chlorosilane, ammonia, oxygen gas, methane, ethane, ethylene, propylene, hydrocarbon, tetramethyldisiloxane, silicon-containing hydrocarbon, or combinations thereof.

In accordance with some embodiments of the present disclosure, the liner layer has a thickness ranging from 1 nm to 5 nm.

In accordance with some embodiments of the present disclosure, the liner layer includes silicon nitride, silicon oxycarbide, silicon carbonitride, silicon oxycarbonitride, or combinations thereof.

In accordance with some embodiments of the present disclosure, a nanosheet semiconductor device includes a metal gate structure, a first source/drain region, a second source/drain region, an inner spacer, a first bottom dielectric insulator, a second bottom dielectric insulator, a first liner, and a second liner. The metal gate structure is disposed on a substrate. The first source/drain region and the second source/drain region are separated from each other by the metal gate structure in a first direction. The inner spacer laterally covers the metal gate structure. Each of the first bottom dielectric insulator and the second bottom dielectric insulator is disposed between a corresponding one of the first and second source/drain regions and the substrate. Each of the first liner and the second liner is disposed to separate a corresponding one of the first and second bottom dielectric insulators from the substrate.

In accordance with some embodiments of the present disclosure, each of the first and second liners has a thickness ranging from 1 nm to 5 nm.

In accordance with some embodiments of the present disclosure, a vertical distance between a topmost point of each of the first and second liners and a top surface of the substrate ranges from 1 nm to 10 nm.

In accordance with some embodiments of the present disclosure, a vertical distance between a bottommost point of a lower surface of each of the first and second liners and a top surface of the substrate ranges from 3 nm to 20 nm.

In accordance with some embodiments of the present disclosure, a topmost point of each of the first and second liners is located at a level between an upper surface of the inner spacer and a lower surface of the inner spacer.

In accordance with some embodiments of the present disclosure, each of the first and second liners is in partial contact with the inner spacer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a nanosheet semiconductor device, comprising:
   forming a liner layer to cover a first fin structure and a second fin structure that are disposed on a substrate and that are spaced apart from each other in a first direction, each of the first fin structure and the second fin structure including a stacked structure disposed on the substrate, a poly gate disposed on the stacked structure in a second direction transverse to the first direction, and a plurality of inner spacers, the stacked structure including a plurality of sacrificial features and a plurality of channel features disposed to alternate with the plurality of sacrificial features in the second direction, the plurality of inner spacers laterally covering the plurality of sacrificial features;
   forming a dielectric layer to cover the liner layer, the dielectric layer including an upper portion, a lower portion, and an interconnecting portion that extends in the second direction to interconnect the upper portion and the lower portion and that laterally covers the liner layer;
   subjecting the upper portion and the lower portion of the dielectric layer to a directional treatment, so that the upper portion and the lower portion of the dielectric layer are denser than the interconnecting portion of the dielectric layer; and
   removing the upper portion and the interconnecting portion of the dielectric layer and a portion of the liner layer, so as to form a liner on the substrate and a bottom dielectric insulator that is disposed on the liner and that is separated from the substrate by the liner.

2. The method of claim 1, wherein the liner layer is formed by thermal chemical vapor deposition.

3. The method of claim 2, wherein the thermal chemical vapor deposition is conducted at a temperature ranging from 450° C. to 550° C.

4. The method of claim 2, wherein the thermal chemical vapor deposition is conducted for a deposition period ranging from 60 seconds to 120 seconds.

5. The method of claim 2, wherein a gas used in the thermal chemical vapor deposition includes chlorosilane, ammonia, oxygen gas, methane, ethane, ethylene, propylene, hydrocarbon, tetramethyldisiloxane, silicon-containing hydrocarbon, or combinations thereof.

6. The method of claim 1, wherein the liner layer has a thickness ranging from 1 nm to 5 nm.

7. The method of claim 1, wherein the liner layer includes silicon nitride, silicon oxycarbide, silicon carbonitride, silicon oxycarbonitride, or combinations thereof.

8. A method for manufacturing a nanosheet semiconductor device, comprising:
   forming a liner layer to cover a first fin structure and a second fin structure that are disposed on a substrate and that are spaced apart from each other by a trench in a first direction, each of the first fin structure and the second fin structure including a stacked structure disposed on the substrate, a poly gate disposed on the stacked structure in a second direction transverse to the first direction, and a plurality of inner spacers, the stacked structure including a plurality of sacrificial features and a plurality of channel features disposed to alternate with the plurality of sacrificial features in the second direction, the plurality of inner spacers laterally covering the plurality of sacrificial features;
   forming a dielectric layer to cover the liner layer, the dielectric layer including an upper portion, a lower portion, and an interconnecting portion that extends in the second direction to interconnect the upper portion and the lower portion and that laterally covers the liner layer;
   subjecting the upper portion and the lower portion of the dielectric layer to a directional treatment, so that the upper portion and the lower portions of the dielectric layer are denser than the interconnecting portion of the dielectric layer;
   forming an anti-reflection layer in the trench such that the upper portion and a part of the interconnecting portion of the dielectric layer are exposed from the anti-reflection layer;
   etching away the upper portion and the part of the interconnecting portion of the dielectric layer; and
   removing the anti-reflection layers, a remaining part of the interconnecting portion of the dielectric layer, and a portion of the liner layer, so as to form a liner on the substrate and a bottom dielectric insulator that is disposed on the liner and that is separated from the substrate by the liner.

9. The method of claim 8, wherein the liner layer is formed by thermal chemical vapor deposition.

10. The method of claim 9, wherein the thermal chemical vapor deposition is conducted at a temperature ranging from 450° C. to 550° C.

11. The method of claim 9, wherein the thermal chemical vapor deposition is conducted for a deposition period ranging from 60 seconds to 120 seconds.

12. The method of claim 9, wherein a gas used in the thermal chemical vapor deposition includes chlorosilane, ammonia, oxygen gas, methane, ethane, ethylene, propylene, hydrocarbon, tetramethyldisiloxane, silicon-containing hydrocarbon, or combinations thereof.

13. The method of claim 9, wherein the liner layer has a thickness ranging from 1 nm to 5 nm.

14. The method of claim 9, wherein the liner layer includes silicon nitride, silicon oxycarbide, silicon carbonitride, silicon oxycarbonitride, or combinations thereof.

15. A method for manufacturing a nanosheet semiconductor device, comprising:
   forming a liner layer to cover a first fin structure and a second fin structure that are disposed on a substrate and that are spaced apart from each other in a first direction, each of the first fin structure and the second fin structure including a stacked structure disposed on the substrate, a poly gate disposed on the stacked structure in a second direction transverse to the first direction, and a plurality of inner spacers, the stacked structure including a plurality of sacrificial features and a plurality of channel features disposed to alternate with the plurality of sacrificial features in the second direction, the plurality of inner spacers laterally covering the plurality of sacrificial features;
   forming a dielectric layer to cover the liner layer, the dielectric layer including an upper portion, a lower portion, and an interconnecting portion that extends in the second direction to interconnect the upper portion and the lower portion and that laterally covers the liner layer;
   subjecting the upper portion and the lower portion of the dielectric layer to a directional treatment, so that the upper portion and the lower portion of the dielectric layer are denser than the interconnecting portion of the dielectric layer;
   removing the upper portion and the interconnecting portion of the dielectric layer and a portion of the liner layer, so as to form a liner on the substrate and a bottom dielectric insulator that is disposed on the liner and that is separated from the substrate by the liner; and forming a source/drain region on the liner and the bottom dielectric insulator.

16. The method of claim 15, wherein a vertical distance between a topmost point of the liner and a top surface of the substrate ranges from 1 nm to 10 nm.

17. The method of claim 15, wherein a vertical distance between a bottommost point of a lower surface of the liner and a top surface of the substrate ranges from 3 nm to 20 nm.

18. The method of claim 15, wherein a topmost point of the liner is located at a level between an upper surface of a lowermost one of the plurality of inner spacers and a lower surface of the lowermost one of the plurality of inner spacers, the lowermost one of the plurality of inner spacers being proximate to the substrate.

19. The method of claim 15, wherein the liner is formed to be in partial contact with a lowermost one of the plurality of inner spacers which is proximate to the substrate.

20. The method of claim 15, wherein an upper surface of the bottom dielectric insulator is formed to have a concave shape, and a distance between a bottommost point of the upper surface of the bottom dielectric insulator and a topmost point of the liner is greater than 0 nm and up to 15 nm.

* * * * *